(12) United States Patent
Pelley et al.

(10) Patent No.: US 9,374,093 B2
(45) Date of Patent: Jun. 21, 2016

(54) CAPACITIVELY COUPLED INPUT BUFFER

(71) Applicant: Freescale Semiconductor, Inc., Austin, TX (US)

(72) Inventors: Perry H. Pelley, Austin, TX (US); Ravindraraj Ramaraju, Round Rock, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 240 days.

(21) Appl. No.: 14/152,177

(22) Filed: Jan. 10, 2014

(65) Prior Publication Data

US 2015/0200650 A1 Jul. 16, 2015

(51) Int. Cl.
*H03B 1/00* (2006.01)
*H03K 3/00* (2006.01)
*H03K 19/0185* (2006.01)

(52) U.S. Cl.
CPC ............................ *H03K 19/018521* (2013.01)

(58) Field of Classification Search
CPC ................. H03K 19/00315; H03K 19/00361; H03K 19/0013; H03K 3/012
USPC ......... 327/108–112, 178–180, 205, 206, 185, 327/198–203, 208, 210–212, 214, 261, 263, 327/264, 268, 276–278, 284, 285, 291–294, 327/299, 306–333, 374–391, 530–550, 427, 327/434, 437; 326/82, 83, 87
See application file for complete search history.

(56) References Cited

U.S. PATENT DOCUMENTS

| | | | | |
|---|---|---|---|---|
| 6,005,418 A | * | 12/1999 | Taki | ................... H03K 19/0963 326/113 |
| 6,215,329 B1 | * | 4/2001 | Campardo | ........... G11C 7/1051 326/86 |
| 7,420,394 B2 | | 9/2008 | Kase et al. | |
| 7,429,882 B2 | | 9/2008 | Peterson | |
| 2006/0220704 A1 | | 10/2006 | Butler | |
| 2008/0054975 A1 | * | 3/2008 | Ramaraju | ........ H03K 3/356173 327/218 |
| 2011/0074755 A1 | * | 3/2011 | Brown | ................. G09G 3/3688 345/211 |

* cited by examiner

*Primary Examiner* — Lincoln Donovan
*Assistant Examiner* — Thomas Skibinski

(57) ABSTRACT

A buffer circuit comprising a capacitor, the capacitor comprising a first terminal and a second terminal, an input signal being coupled to the first terminal; a first buffer stage coupled to the second terminal of the capacitor such that the input signal is capacitively coupled to the first buffer stage; and, a pulse generator coupled to control the first buffer stage, the pulse generator being configured to generate a control pulse corresponding to a hold time of the first buffer stage such that the buffer circuit detects a transition of the input signal during the hold time.

20 Claims, 3 Drawing Sheets

CAPACITIVELY COUPLED INPUT BUFFER

BACKGROUND OF THE INVENTION

The present invention relates in general to the field of input buffers and more particularly to capacitively coupled input buffers.

DESCRIPTION OF THE RELATED ART

Input buffers are used to condition signals transmitted to an integrated circuit from an external source. A common input buffer includes a simple CMOS (complementary metal-oxide semiconductor) inverter circuit having a P-channel transistor coupled in series with an N-channel transistor. The gates of the transistors are coupled together to receive an input signal. The circuit of FIG. 1, described below, shows an example input circuit FIG. 1 illustrates a schematic diagram of an input buffer circuit 100. To reduce the crowbar current, input buffer circuit 100 includes a resistor 110 between a P-channel transistor 120 and an N-channel transistor 122 that make up an inverter circuit. There are two outputs from the inverter, labeled "A" and "B," separated from each other by the resistor 110. Output A is coupled to drive the gate of the P-channel transistor 130 and output B is coupled to drive the gate of the N-channel transistor 132. The resistor functions to prevent the P-channel transistor 130 from being conductive at the same time the N-channel transistor 132 is conductive when an input signal IN transitions from, for example, a logic low voltage to a logic high voltage. This reduces the crowbar current and thus reduces power consumption.

An issue for input buffer circuits arises as signal data rates become faster and signal swings become smaller the required tolerance between an input reference voltage and a input signal becomes more difficult to maintain. Further input voltage may exceed the breakdowns of highly scaled transistors. Accordingly, there is a need for an input buffer circuit that is tolerant of large input voltage swings. Under certain conditions, input swings beyond twice the breakdown voltage of transistors may occur.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element. Additionally, active low signals are represented with a bar across the top of the signal name within the Figures and with a # symbol within the text.

DETAILED DESCRIPTION

In general, some embodiments of the present invention relate to a buffer circuit comprising a capacitor, the capacitor comprising a first terminal and a second terminal, an input signal being coupled to the first terminal; a first buffer stage coupled to the second terminal of the capacitor such that the input signal is capacitively coupled to the first buffer stage; and, a pulse generator coupled to control the first buffer stage, the pulse generator being configured to generate a control pulse less than the hold time of the first buffer stage such that the buffer circuit performs a recalibration during the hold time. The hold time corresponds to an amount of time after the clock edge that the data input signal (DIN) needs to be held before changing to assure the data input signal is sensed properly by the input buffer at the clock edge.

In some embodiments the present invention relates to a buffer circuit comprising a first buffer stage coupled to receive an input signal; and, a second buffer stage coupled to receive the input signal, a first reference voltage and a second reference voltage, the second buffer stage enabling the input buffer to have independently settable high and low input thresholds.

Figure 1:
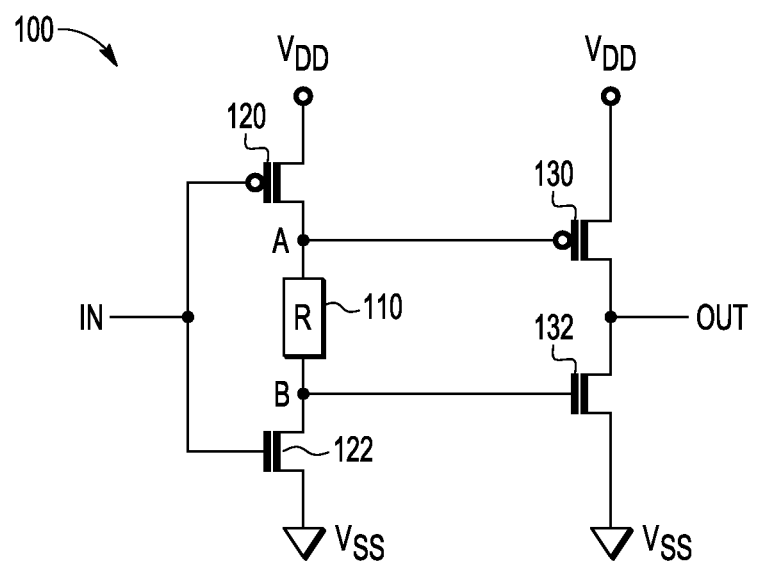
FIG. 1 shows a schematic diagram of a prior art input buffer circuit 10.
Figure 2:
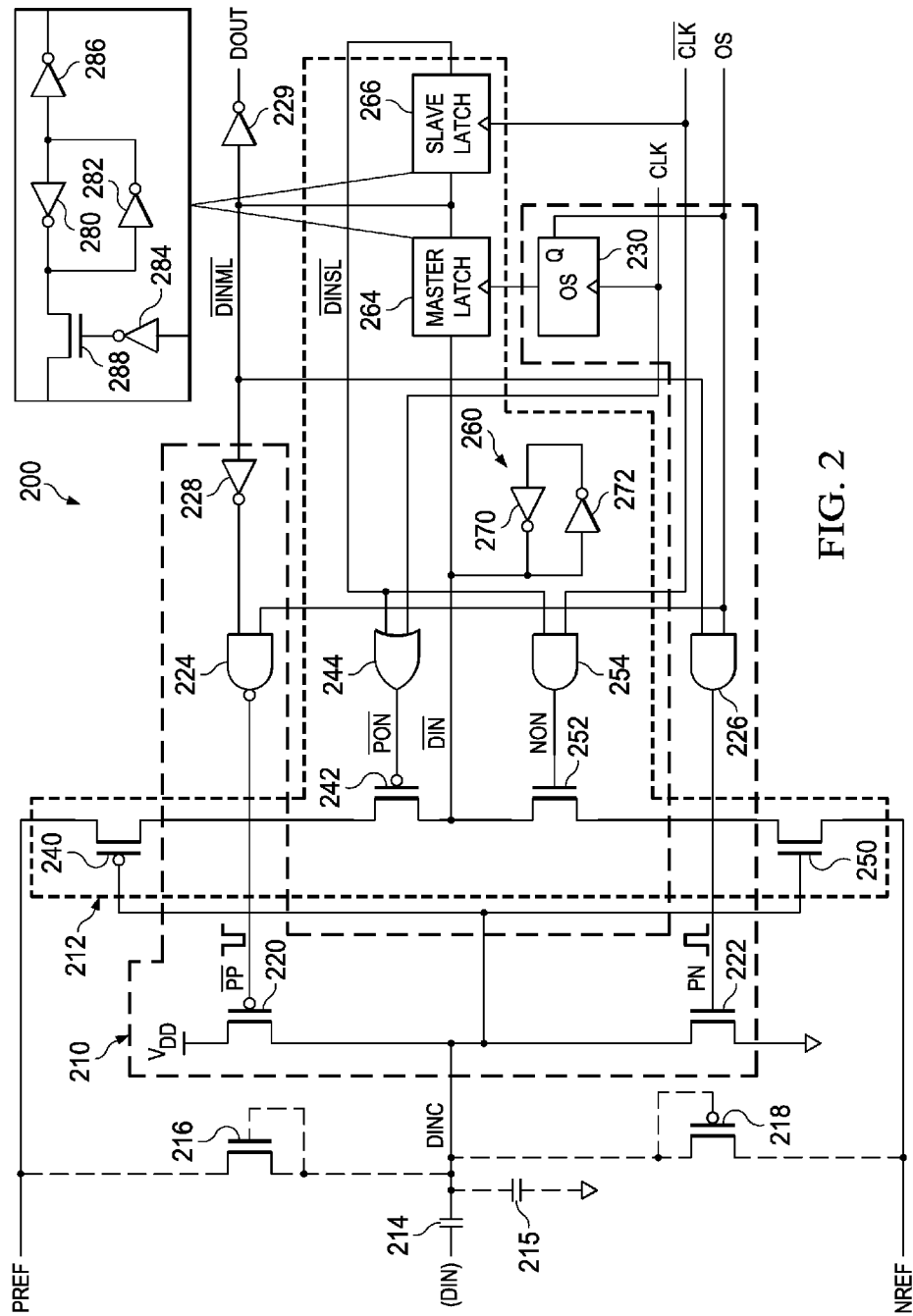
FIG. 2 shows a schematic diagram of an input buffer circuit in accordance with one embodiment of the present invention.

Referring to FIG. 2 a schematic diagram of an input buffer circuit 200 in accordance with one embodiment of the present invention. More specifically, the input buffer circuit 200 includes a voltage calibration portion 210 and a threshold configuration portion 212. The voltage calibration portion 210 provides the input buffer circuit 200 with an ability to calibrate an input voltage relative to internal supplies. The threshold configuration portion 212 provides the input buffer circuit 200 with an ability to have two independently configuration threshold values.

The input buffer circuit also includes an input capacitor 214. Because the input signal is capacitively coupled, the buffer circuit detects transitions of the data input signal rather than absolute voltage of the input signal. Additionally, in certain embodiments, the buffer circuit 200 also includes a capacitor 215. The capacitor 215 may be used to divide specified larger input signals down to an internal supply voltage range. This allows the buffer circuit 200 to tune the input voltage. Additionally, in certain embodiments, the input buffer circuit includes an N-channel transistor 216. Additionally, in certain embodiments, the input buffer circuit includes a P-channel transistor 218. The N-channel transistor 216 may be used to provide an upper input range clamping function. The P-channel transistor 218 may be used to provide a lower input range clamping function.

The input buffer circuit receives a data in signal (DIN) and provides a data out signal (DOUT). The input buffer circuit also receives a positive reference signal (PREF) and a negative reference signal (NREF) as well as a clock signal (CLK). In certain embodiments the PREF signal is a certain percentage (e.g., within +/−40 percent) of VDD including the actual value of VDD and the NREF signal is a certain percentage (e.g., within +/−40 percent) of the low level signal including the actual value of GND.

The voltage calibration portion 210 includes a P-channel transistor 220, an N-channel transistor 222, a NAND gate 224, an AND gate 226, an inverter 228 and a one shot circuit 230 (i.e., a pulse generator). In general, recalibration (voltage level restoration) of the input buffer circuit 200 occurs within a few gate delays of the clock signal (i.e., within the hold time of the input signal DIN relative to the clock signal CLK) by resetting the voltage of the signal DINC at the output of capacitor 214 relative to the internal supply voltage of the input buffer circuit 200. The voltage calibration portion 210 allows the buffer circuit 200 to restore a high level (VDD) (e.g., a voltage between 1.0 and 2.0V) to the DINC signal during a hold time when the input signal DIN is high or to restore a low level (e.g., ground) to DINC for a low data input signal DIN. The voltage levels on the signal DIN may not be the same as the voltage levels as those on signal DINC even after the calibration since the purpose of the recalibration is to restore the value of DINC to a voltage level of a buffer 200 voltage supply independent of the input voltage DIN. When the CLK signal causes the one shot 230 to issue a pulse that is shorter than the hold time of the input signal DIN relative to the clock signal CLK. AND gate 226 or inverter 228 and NAND gate 224 pass the pulse to N channel transistor 222 or P-channel transistor 220 depending on the input level of input signal DIN. When the input signal DIN is high, a high level (VDD) is restored to the capacitor. When the input signal DIN is low, a low level (ground) is restored to the capacitor. With embodiments including capacitor 215, the capacitor 214 and capacitor 215 voltage divide the input signal DIN such that the output signal of the capacitor 214 DINC switches approximately between VDD and ground. With embodiments including transistors 215 and 218, the two transistors limit the voltage swing on the output DINC of capacitor 214 to a single transistor threshold beyond the supplies (VDD or ground).

The threshold configuration portion 212 includes a P-channel transistor 240, a P-channel transistor 242, an OR gate 244, an N-channel transistor 250, an N-channel transistor 252, and an AND gate 254. The threshold configuration portion also includes a latch 260, a master latch 264 and a slave latch 266. In certain embodiments, the latch 260 includes cross coupled inverters 270, 272. Additionally, in certain embodiments each of the master latch 264 and slave latch 266 each include cross coupled inverters 280, 282, inverters 284, 286 and an N-channel transistor 288.

In general, both input stage trip points of the input buffer circuit 200 are set by external references. More specifically, the low level input trip point is PREF minus a P-channel threshold voltage and the high level trip point is PREF plus an N-channel threshold voltage. The PREF and NREF signals provide a fixed voltage plus P-channel threshold and a second fixed voltage minus an N-channel threshold respectively to compensate and track the thresholds of transistors 240 and 250 such that the input trip points are stable independent of process, supply voltage or temperature (PVT). Input swings into the input stage are limited to voltages compatible with transistor breakdowns, even with larger pad voltages swings as described above. Additionally, during operation, only the input stage P-devices or alternatively the input stage N-devices are on in anticipation of the next voltage transition. The input thresholds may be set wider apart when the input buffer 200 is located within noisy systems and closer together when the input buffer 200 is located within low noise systems. Additionally, because the thresholds are independently configurable, the input buffer may be adjusted based upon whether only either the positive or negative portions of the signal are noisier. When the input DIN is low the input stage N-transistor 252 is switched on in anticipation of the input signal DIN switching to a high level. When the input DIN is high the P-transistor 242 is switched on in anticipation of the input signal DIN switching to a low level. The latch comprising inverters 212 and 214 holds the input DIN# to master latch stable for the condition when neither transistors 242 or 252 are on. The master latch 264 holds the signal DIN# in the form of signal DINSL# for the following cycle so that NOR gate 244 and NAND gate 254 provide the proper signals PON# and NON respectively in anticipation of transition DIN to opposite state of the previous clock cycle. For cycles where input signal DIN does not change the circuits of threshold configuration portion 212 remain in the same state as the previous cycle waiting for a change of input signal DIN.

Figure 3:
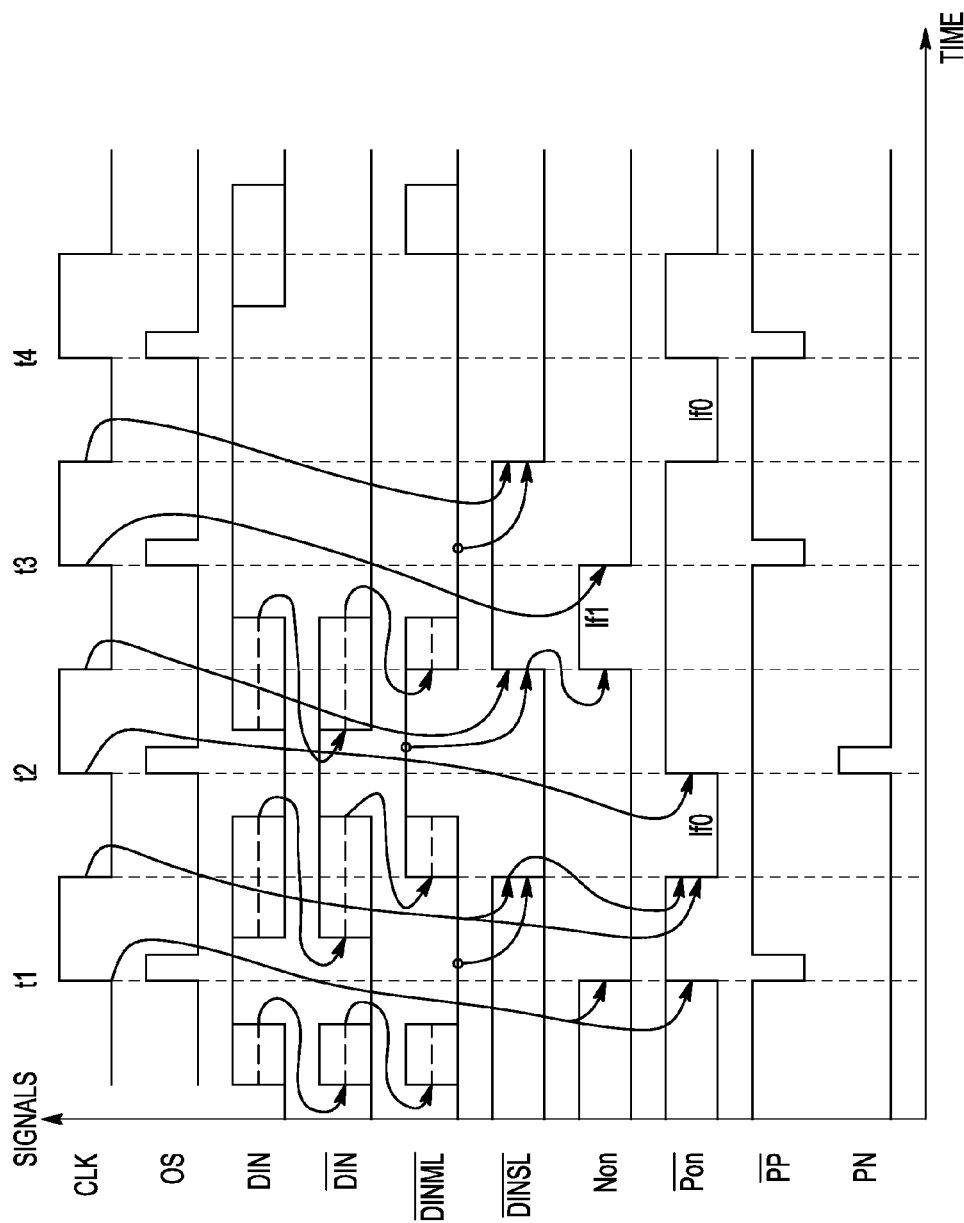
FIG. 3 shows a timing diagram of various signals of the input buffer circuit.

FIG. 3 shows a timing diagram of various signals of the input buffer circuit. More specifically, the clock signal (CLK) is provided to the one shot 230 causing the one shot circuit 230 to generate a one shot signal (OS) pulse on every rising edge of the clock signal. The one shot signal pulse has a duration less than the hold time for the input buffer circuit 200, but long enough to restore the voltage on the signal DINC at the output of capacitor 214. Thus the one shot pulse turns on the capacitor recharge function of the capacitor 214 via the P-channel transistor 220 or the N-channel transistor 222 for the appropriate time.

The one shot signal pulse is then provided to the NAND gate 224 as well as the AND gate 226. The NAND gate 224 generates a P-Channel pulse in signal (PP#) which is provided to the gate of the P-Channel transistor 220 at time t1, t3, and t4 in response to CLK. The AND gate 226 generates an N-Channel pulse in signal (PN) which is provided to the gate of the N-Channel transistor 222 at time t2 in response to the CLK. The P-channel transistor 220 is active when a low gate voltage (i.e., the PP# signal is active) is applied. The N-channel transistor 222 is active when a high gate voltage (i.e., the PN signal is active) is applied. Thus, when the PP# signal is active, the capacitive data input signal (DINC) is pulled high whereas when the PN signal is active, the capacitive data input signal is pulled low. In this way, the voltage across capacitor 214 is restored to local supply VDD or ground every cycle.

The capacitive data input signal DINC is also provided to the gate of P-channel transistor 240 and the gate of N-channel transistor 250. The source of the P-channel transistor 240 is coupled to the positive reference signal PREF signal and the source of the N-channel transistor 250 is coupled to the negative reference signal NREF. The drain of the P-channel transistor 240 is coupled to the source of P-channel transistor 242. The drain of the N-channel transistor 250 is coupled to the source of the N-channel transistor 252. The gate of the P-channel transistor 242 receives an active low Pon signal (Pon#) during the second phase of CLK cycle t1-t2 and the gate of the N-channel transistor 252 receives an Non signal (Non) during the second phase of CLK cycle t2-t3 holding those values until after the clock of the following cycle. The drain of the P-channel transistor 242 and the drain of the N-channel transistor 252 are coupled together to provide an active low switched data in signal (DIN#) which is either pulled high or low depending on whether the Pon signal or the Non signal is active. Each input stage trip point of the input buffer circuit 200 is independently configurable by the external reference signals PREF and NREF. Additionally, input swings into the input stage are limited to voltages compatible with transistor breakdowns, even with larger pad voltages swings.

Additionally, the latch 260 latches the DIN# signal to prevent the DIN# signal from decoupling when it is not actively driven. The DIN# signal is provided as an input to the master latch 264. The master latch is clocked by the clock signal CLK. The master latch 264 generates an active low master latched data in signal (DINML#) which is provided as an input to the slave latch 266. The active low master latched data in signal is also provided to inverter 228 and inverter 229. Inverter 229 provides the latched output signal DOUT. The signal DINML# determines whether the signal PP# or the signal PN is activated when the one shout signal OS is activated.

The slave latch 266 is clocked by an inverted clock signal (CLK#) and provides an active low slave latched data in signal (DINSL#). The active low slave latched data in signal is provided as an input to OR gate 244 and AND gate 254, which each also receive the inverted clock signal. Thus the active low slave latched data in signal controls whether to turn on P-channel transistor 242 or N-channel transistor 252.

Accordingly, during operation, only the input stage P-devices or alternatively the input stage N-devices is on in anticipation of the next voltage transition.

Various illustrative embodiments have been described in detail with reference to the accompanying figures. While various details are set fourth in the description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, to avoid limiting or obscuring the present invention. Also for example various combinations of the various components within described circuits are within the scope of the present invention.

In the present invention, a transistor may be conceptualized as having a control terminal which controls the flow of current between a first current handling terminal and a second current handling terminal. An appropriate condition on the control terminal causes a current to flow from/to the first current handling terminal and to/from the second current handling terminal. In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current exiting the base causes an emitter-to-collector current to flow.

A MOS transistor may likewise be conceptualized as having a control terminal which controls the flow of current between a first current handling terminal and a second current handling terminal. When current is flowing between the first current handling terminal and the second current handling terminal the transistor is on and when current is not flowing between the first current handling terminal and the second current handling terminal the transistor is off. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equations merely refers to whichever diffusion (drain or source) has the lower voltage at any given time. For example, the "source" of an N channel device of a bi-directional CMOS transfer gate depends on which side of the transfer gate is at a lower voltage. To reflect the symmetry of most N channel MOS transistors, the control terminal is the gate, the first current handling terminal may be termed the "drain/source," and the second current handling terminal may be termed the "source/drain." Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source," with an implicit understanding that the two are not distinct, but interchangeable.

Consequently, the invention is intended to be limited only by the spirit and scope of the appended claims, giving full cognizance to equivalents in all respects.

What is claimed is:

1. A buffer circuit comprising:
 a capacitor, the capacitor comprising a first terminal and a second terminal, an input signal being coupled to the first terminal;
 a first buffer stage coupled to the second terminal of the capacitor such that the input signal is capacitively coupled to the first buffer stage, the first buffer stage comprising a data hold time; and,
 a pulse generator coupled to control the first buffer stage, the pulse generator being configured to generate a control pulse within the data hold time of the first buffer stage such that the second terminal of the capacitor is restored to a level corresponding to a level of the input signal during the data hold time.

2. The buffer circuit of claim 1 wherein:
 the first buffer stage comprises a first transistor and a second transistor, the control pulse of the pulse generator being coupled to a gate of the first transistor, an inverse of the control pulse being coupled to a gate of the second transistor such that only one of the first transistor and the second transistor are on during a particular hold time.

3. The buffer circuit of claim 2 wherein:
 the first buffer stage comprises a first logic gate and a second logic gate, the first logic gate and the second logic gate each receiving the control pulse of the pulse generator, an output of the first logic gate coupled to the gate of the first transistor and coupling the control pulse to the gate of the first transistor and an output of the second logic gate coupled to the gate of the second transistor and coupling an inverse of the control pulse to the gate of the second transistor.

4. The buffer circuit of claim 1 further comprising:
 a second capacitor coupled between the second terminal of the capacitor and ground, the capacitor and the second capacitor providing a voltage divider, the voltage divider dividing a larger input signal voltage down to an internal supply voltage range.

5. A buffer circuit comprising:
 a first buffer stage coupled to receive an input signal and a first reference voltage and a second reference voltage, the first buffer stage enabling the buffer circuit to have independently settable high and low input thresholds based upon the first reference voltage and the second reference voltage.

6. The buffer circuit of claim 5 wherein:
 the first buffer stage comprises a first transistor and a second transistor, the input signal being provided to a control terminal of the first transistor and a control terminal of the second transistor;
 the first reference voltage being provided to a first current handling terminal of the first transistor, the second reference voltage being provided to a first current handling terminal of the second transistor.

7. The buffer circuit of claim 5 wherein:
 the first buffer stage comprises a third transistor and a fourth transistor,
 a second current handling terminal of the first transistor being coupled to a first current handling terminal of the third transistor;

a second current handling terminal of the second transistor being coupled to a first current handling terminal of the fourth transistor;

a second current handling terminal of the third transistor and a second current handling terminal of the fourth transistor being coupled together to provide an output of the first buffer stage.

8. The buffer circuit of claim 7 wherein:

the first buffer stage comprises a first logic gate and a second logic gate, an output of the first logic gate coupled to a gate of the third transistor and providing a third transistor control signal to the gate of the third transistor and an output of the second logic gate coupled to a gate of the fourth transistor and providing a fourth transistor control signal to the gate of the fourth transistor.

9. The buffer circuit of claim 8 wherein:

the buffer circuit further comprises a second buffer stage, the second buffer stage comprising a latch, the latch latching a threshold calibrated input signal to prevent coupling to a calibrated input signal.

10. The buffer circuit of claim 8 wherein:

the first and second logic gates each receive a clock signal.

11. A method comprising:

receiving an input signal at a first terminal of a capacitor, the capacitor comprising the first terminal and a second terminal;

providing a capacitive input signal to a first buffer stage coupled from a second terminal of the capacitor such that the input signal is capacitively coupled to the first buffer stage, the first buffer stage comprising a data hold time;

generating a control pulse within the data hold time of the first buffer stage; and, controlling the first buffer stage via the control pulse such that the second terminal of the capacitor is restored to a level corresponding to a level of the input signal during the data hold time.

12. The method of claim 11 wherein:

the first buffer stage comprises a first transistor and a second transistor, the control pulse being coupled to a gate of the first transistor, an inverse of the control pulse being coupled to a gate of the second transistor such that only one of the first transistor and the second transistor are on during a particular hold time.

13. The method of claim 12 wherein:

the first buffer stage comprises a first logic gate and a second logic gate, the first logic gate and the second logic gate each receiving the control pulse, an output of the first logic gate coupled to the gate of the first transistor and coupling the control pulse to the gate of the first transistor and an output of the second logic gate coupled to the gate of the second transistor and coupling inverse of the control pulse to the gate of the second transistor.

14. The method of claim 11 wherein:

a second capacitor is coupled between the second terminal of the capacitor and ground, the capacitor and the second capacitor providing a voltage divider, the voltage divider dividing a larger input signal voltage down to an internal supply voltage range.

15. A method comprising:

receiving an input signal at a first buffer stage of a buffer; and, receiving a first reference voltage and a second reference voltage, the first buffer stage enabling the buffer to have independently settable high and low input thresholds based upon the first reference voltage and the second reference voltage.

16. The method of claim 15 wherein:

the first buffer stage comprises a first transistor and a second transistor, the input signal being provided to a control terminal of the first transistor and a control terminal of the second transistor;

the first reference voltage being provided to a first current handling terminal of the first transistor, the second reference voltage being provided to a first current handling terminal of the second transistor.

17. The method of claim 16 wherein:

the first buffer stage comprises a third transistor and a fourth transistor, a second current handling terminal of the first transistor is coupled to a first current handling terminal of the third transistor;

a second current handling terminal of the second transistor is coupled to a first current handling terminal of the fourth transistor;

a second current handling terminal of the third transistor and a second current handling terminal of the fourth transistor are coupled together to provide an output of the first buffer stage.

18. The method of claim 17 wherein:

the first buffer stage comprises a first logic gate and a second logic gate, an output of the first logic gate coupled to a gate of the third transistor and providing a third transistor control signal to the gate of the third transistor and an output of the second logic gate coupled to a gate of the fourth transistor and providing a fourth transistor control signal to the gate of the fourth transistor.

19. The method of claim 18 wherein:

the buffer circuit further comprises a second buffer stage, the second buffer stage comprising a latch, the latch latching a threshold calibrated input signal to prevent coupling to a calibrated input signal.

20. The buffer circuit of claim 18 wherein:

the first and second logic gates each receive a clock signal.

* * * * *